(12) United States Patent
Wang et al.

(10) Patent No.: US 7,619,392 B2
(45) Date of Patent: *Nov. 17, 2009

(54) METHOD FOR VERIFYING SMART BATTERY FAILURES BY MEASURING INPUT CHARGING VOLTAGE AND ASSOCIATED SYSTEMS

(75) Inventors: Ligong Wang, Round Rock, TX (US); Guangyong Zhu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/380,613

(22) Filed: Mar. 2, 2009

(65) Prior Publication Data

US 2009/0167249 A1    Jul. 2, 2009

Related U.S. Application Data

(62) Division of application No. 11/021,377, filed on Dec. 23, 2004, now Pat. No. 7,518,341.

(51) Int. Cl.
*H02J 7/00* (2006.01)
(52) U.S. Cl. ........................... 320/134; 320/136
(58) Field of Classification Search ............ 320/136, 320/134; 361/90, 91.3, 93.1, 101
See application file for complete search history.

(56) References Cited

U.S. PATENT DOCUMENTS 4,746,854 A * 5/1988 Baker et al. ............ 320/130
5,007,027 A * 4/1991 Shimoi ..................... 365/229
5,144,218 A   9/1992 Bosscha ..................... 320/44

(Continued)

FOREIGN PATENT DOCUMENTS

EP       0607041 A2    7/1994

(Continued)

OTHER PUBLICATIONS

Dallas Semiconductor, "*DS2762 High-Precision Li+ Battery Monitor With Alerts*," Maxim datasheets pp. 1-25, Rev 111703 (2003).

(Continued)

*Primary Examiner*—Bao Q Vu
*Assistant Examiner*—Jue Zhang
(74) *Attorney, Agent, or Firm*—O'Keefe, Egan, Peterman & Enders, LLP

(57) ABSTRACT

A method and associated system are disclosed for verifying charging failures for smart batteries by measuring input charging voltage and associated systems. In one embodiment, a determination is made whether or not a charging current is indicative of a battery failure by utilizing an analog-to-digital (A/D) port to measure the input charging voltage. As long as the measured input charging voltage is below the cell pack voltage or some set voltage value, whichever is higher, the BMU considers a charging current detection to be a false failure indication. If the measured charging voltage is above the cell pack voltage or a set voltage value, whichever is lower, the BMU considers the charging current detection to be a positive failure indication. The BMU can then disable the battery or implement other verification steps before disabling the battery, as desired.

18 Claims, 3 Drawing Sheets

U.S. PATENT DOCUMENTS

| | | | | |
|---|---|---|---|---|
| 5,155,428 | A | 10/1992 | Kang | 320/13 |
| 5,530,336 | A | 6/1996 | Eguchi et al. | 320/5 |
| 5,581,170 | A | 12/1996 | Mammano et al. | 320/17 |
| 5,652,501 | A | 7/1997 | McClure et al. | 320/17 |
| 5,703,463 | A | 12/1997 | Smith | 320/13 |
| 5,898,234 | A * | 4/1999 | Kitagawa | 320/128 |
| 5,986,865 | A | 11/1999 | Umeki et al. | 361/86 |
| 6,031,302 | A * | 2/2000 | Levesque | 320/134 |
| 6,046,575 | A * | 4/2000 | Demuro | 320/134 |
| 6,051,955 | A * | 4/2000 | Saeki et al. | 320/121 |
| 6,060,864 | A * | 5/2000 | Ito et al. | 320/134 |
| 6,075,344 | A | 6/2000 | Kawai | 320/134 |
| 6,097,175 | A | 8/2000 | Yoon | 320/132 |
| 6,124,700 | A | 9/2000 | Nagai et al. | 320/132 |
| 6,157,171 | A | 12/2000 | Smith | 320/133 |
| 6,172,485 | B1 | 1/2001 | Fujita et al. | 320/136 |
| 6,174,617 | B1 | 1/2001 | Hiratsuka et al. | 429/90 |
| 6,204,633 | B1 | 3/2001 | Kitagawa | 320/128 |
| 6,222,346 | B1 * | 4/2001 | Mori | 320/134 |
| 6,268,713 | B1 | 7/2001 | Thandiwe | 320/134 |
| 6,388,426 | B1 | 5/2002 | Yokoo et al. | 320/136 |
| 6,445,164 | B2 | 9/2002 | Kitagawa | 320/134 |
| 6,492,791 | B1 | 12/2002 | Saeki et al. | 320/135 |
| 6,495,989 | B1 | 12/2002 | Eguchi | 320/132 |
| 6,531,846 | B1 | 3/2003 | Smith | 320/134 |
| 6,571,091 | B1 | 5/2003 | Janssen et al. | 455/343 |
| 6,636,020 | B1 | 10/2003 | Ronald | 320/134 |
| 6,646,422 | B2 | 11/2003 | Hogari | 320/134 |
| 6,683,449 | B1 | 1/2004 | Bell et al. | 324/158.1 |
| 6,710,992 | B2 * | 3/2004 | Pannwitz et al. | 361/90 |
| 6,777,915 | B2 | 8/2004 | Yoshizawa et al. | 320/137 |
| 6,804,098 | B2 * | 10/2004 | Pannwitz | 320/134 |
| 6,996,734 | B2 | 2/2006 | Fiebrich et al. | 713/340 |
| 7,436,151 | B2 | 10/2008 | Wang et al. | 320/134 |
| 2001/0021092 | A1 * | 9/2001 | Astala | 320/134 |
| 2002/0195996 | A1 | 12/2002 | Nakatsuji | 320/127 |
| 2003/0107347 | A1 | 6/2003 | Yoshizawa et al. | 320/150 |
| 2003/0193318 | A1 | 10/2003 | Ozawa et al. | 320/132 |
| 2004/0227490 | A1 | 11/2004 | MacNair, Jr. et al. | 320/132 |

FOREIGN PATENT DOCUMENTS

| | | |
|---|---|---|
| EP | 1594209 A1 | 11/2005 |
| EP | 1533881 A2 | 9/2007 |
| JP | 2000078760 A | 8/1998 |
| JP | 11-206025 | 7/1999 |
| JP | 11234910 A | 8/1999 |
| KR | 1998-077419 | 11/1998 |
| KR | 1999-017606 | 3/1999 |
| WO | 00/51219 | 8/2000 |

OTHER PUBLICATIONS

Dallas Semiconductor, "*DS2762 High-Precision Li+ Battery Monitor With Alerts*," Maxim datasheets pp. 1-25, Rev:010906 (2003).

* cited by examiner

METHOD FOR VERIFYING SMART BATTERY FAILURES BY MEASURING INPUT CHARGING VOLTAGE AND ASSOCIATED SYSTEMS

RELATED APPLICATIONS

This application is a divisional application of the following application: application Ser. No. 11/021,377 entitled "METHOD FOR VERIFYING SMART BATTERY FAILURES BY MEASURING INPUT CHARGING VOLTAGE AND ASSOCIATED SYSTEMS," filed on Dec. 23, 2004, now U.S. Pat. No. 7,518,341 which is hereby incorporated by reference in its entirety.

TECHNICAL FIELD OF THE INVENTION

This invention relates to smart batteries for information handling systems and, more particularly, to failure detection in such smart batteries.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems, such as laptop computer systems, have the ability to utilize one or more batteries as a power source. In addition, these same systems can also often utilize power obtained through a power converter coupled to a power grid, such as an alternating-current-to-direct-current (AC/DC) converter plugged into a wall socket. When the system is plugged into the wall, the battery in the system can be charged at the same time. As battery technology has improved, batteries have become more intelligent in that they include circuitry to manage their operations and to report conditions about the battery operations to external circuitry, such as microprocessors. These intelligent batteries are often called "smart" batteries. Many smart batteries have the ability to monitor the charging process, and many batteries have failure detection mechanisms to determine when the battery is malfunctioning. To protect users, the smart batteries can be configured to deactivate themselves permanently if a dangerous malfunction has been detected.

Certain current battery packages rely upon a charge field-effect-transistor (C-FET) and a discharge FET (D-FET) to control the normal charge and discharge function of the battery. Battery protect is typically governed by the battery management unit (BMU). In the event of a battery system failure detection (such as over-voltage charging or overloading) or a battery cell failure detection, the BMU in prior these battery systems would either temporarily disable the C-FET and D-FET to disconnect the battery from the system or permanently disable the battery by blowing a disable fuse.

One significant problem associated with this BMU operation is the possibility that a battery will be disabled due to a false detection of a battery failure. This false detection can lead to significant numbers of field returns of operational batteries that have been disabled due to false failure detections. For example, a false detection of a battery failure can often be the result of temporary environmental events, such as strong electro-magnetic interference (EMI), radio-frequency (RF) signals and/or other electro-magnetic (EM) influences, that cause a small charging current to be detected when none is supposed to exist, such as when the battery is in sleep or discharge mode. When the BMU detects a charging current that was supposed to be zero in such circumstances, the BMU will often place the battery into permanent failure mode due to this non-zero condition being deemed a critical protection failure. A charging current when no charging current should exist is often associated with an internal battery failure that could cascade into a catastrophic event, such as a battery short or explosion. As such, the BMU will disable the battery to protect the user. However, if the current were due to a temporary EM event as described above, the disabling of the battery would be unnecessary.

To address this problem, prior battery systems have attempted various solutions. One solution is to increase the current protection threshold for when an improper charging current will be deemed to trigger a possibility for catastrophic failure. Another solution is to extend the response time from the time when battery initially detects this problem to the time battery BMU finally decides to put the battery to permanent failure mode. Both of these solutions reduce the chance that the battery will be disabled due to EM influences. However, although these solutions do improve battery performance, these solutions also sacrifice safety protections.

Another proposed solution is to add a switch in the battery charging and discharging path and to detect the amount of time an abnormal current lasts. With the added switch turned off, if an abnormal current goes away within a preset time limit, which can be BIOS controlled, the failure can be considered to be temporary. In this circumstance, the battery will not be permanently disabled, and the added switch will be turned on again. This solution, however, has cost and power disadvantages. In particular, this solution increases the cost of the battery pack by requiring an additional switch and increases power dissipation inside the battery thereby increasing internal pack temperatures and reducing the battery capacity available to the system.

SUMMARY OF THE INVENTION

The present invention provides a method for verifying charging failures for smart batteries by measuring input charging voltage and associated systems. In one embodiment, the present invention, as described in more detail below, determines whether or not a charging current is indicative of a battery failure by utilizing an analog-to-digital (A/D) port to measure the input charging voltage. As long as the measured input charging voltage is below the cell pack voltage or some set voltage value, whichever is higher, the BMU considers a charging current detection to be a false failure indication. If the measured charging voltage is above the cell pack voltage or a set voltage value, whichever is lower, the BMU considers the charging current detection to be a positive failure indication. The BMU can then disable the battery or implement other verification steps before disabling the battery, as desired.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server computer system, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of non-volatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The present invention provides a method for verifying charging failures for smart batteries by measuring input charging voltage and associated systems. In the embodiment described in more detail below, a determination is made whether or not a charging current is indicative of a battery failure utilizing an analog-to-digital (A/D) port to measure the input charging voltage. As long as the measured input charging voltage is below the cell pack voltage or some set voltage value, whichever is higher, the battery management unit (BMU) would consider a charging current detection to be a false failure indication. If the measured charging voltage is above the cell pack voltage or a set voltage value, whichever is lower, the BMU would consider the charging current detection a positive failure indication. The BMU could then disable the battery or could implement other verification steps before disabling the battery. It is noted that the set voltage level could be programmed, if desired, and could be 7.5 volts for 3-cell packs and 10 volts for 4-cell packs.

Figure 1:
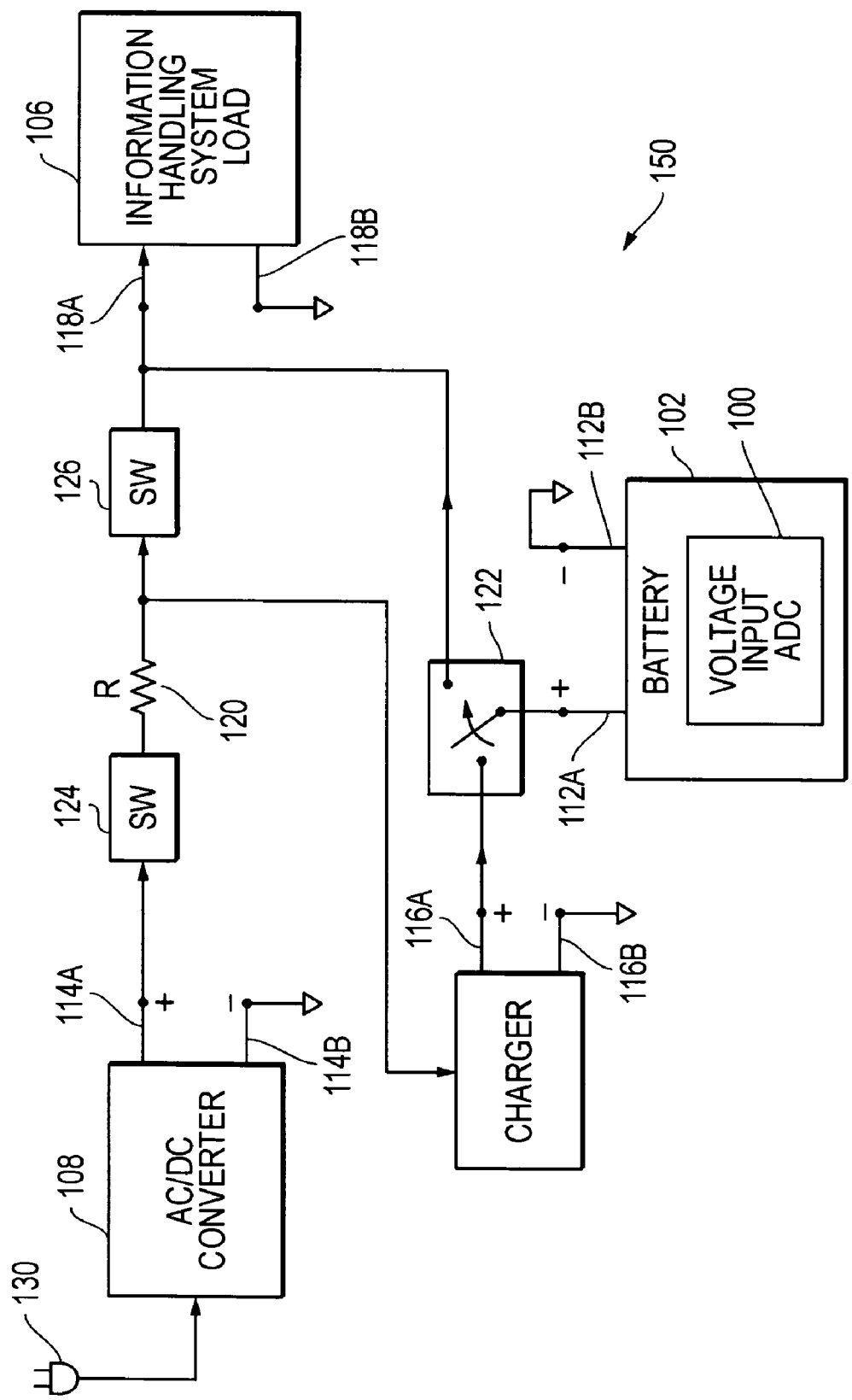
FIG. 1 is a block diagram for an information handling system having the ability to draw power through an AC/DC converter or from a battery, which can be charged through the AC/DC converter.

FIG. 1 is a block diagram for an information handling system 150 having the ability to draw power through an AC/DC converter 108 or from a battery 102, which can be charged through the AC/DC converter 108. In the embodiment depicted, the load 106 represents the devices and circuitry within the information handling system 150 that are driven or powered by the battery 102 or through AC/DC converter 108. The plug 130 is configured to be inserted into a wall socket that is coupled to an alternating current (AC) power grid or other AC power source. The AC/DC converter 108 converts the AC power to direct current (DC) power. The negative terminal 114B of the AC/DC converter 108 is coupled to ground. The positive terminal 114A of the AC/DC converter 108 is coupled to the positive terminal 118A of load 106 through switch 124, protection resistor (R) 120, and switch 124. The negative terminal 118B of load 106 is coupled to ground. The battery 102 also has its negative terminal 112B coupled to ground. Battery 102 has its positive terminal coupled through two-way switch 122 to both the positive terminal 118A of load 106 and to the positive terminal 116A of charger 104. The battery 102 also includes a voltage input analog-to-digital converter (ADC) 100, which is described in more detail below. Charger 104 has its negative terminal 116B coupled to ground. Charger 104 is also coupled to the positive terminal 114A of AC/DC converter 108 through protection resistor (R) 120 and switch 124.

In AC power mode of operation, switches 124 and 126 are closed, and the load 106 is powered from the AC power source through plug 130. In addition, switch 122 is connected to the positive terminal 116A of charger 104 so that the battery 102 can be charged. If the battery 102 does need to be charged, the BMU for the battery 102 will initiate a charging mode of operation for the battery 102. In a battery mode of operation, switches 124 and 126 are open, and switch 122 is connected to the positive terminal 118A of load 106. Thus, load 106 is powered by the battery 102. In this mode of operation, the BMU for the battery 102 will initiate a discharging mode of operation for the battery 102.

Figure 2:
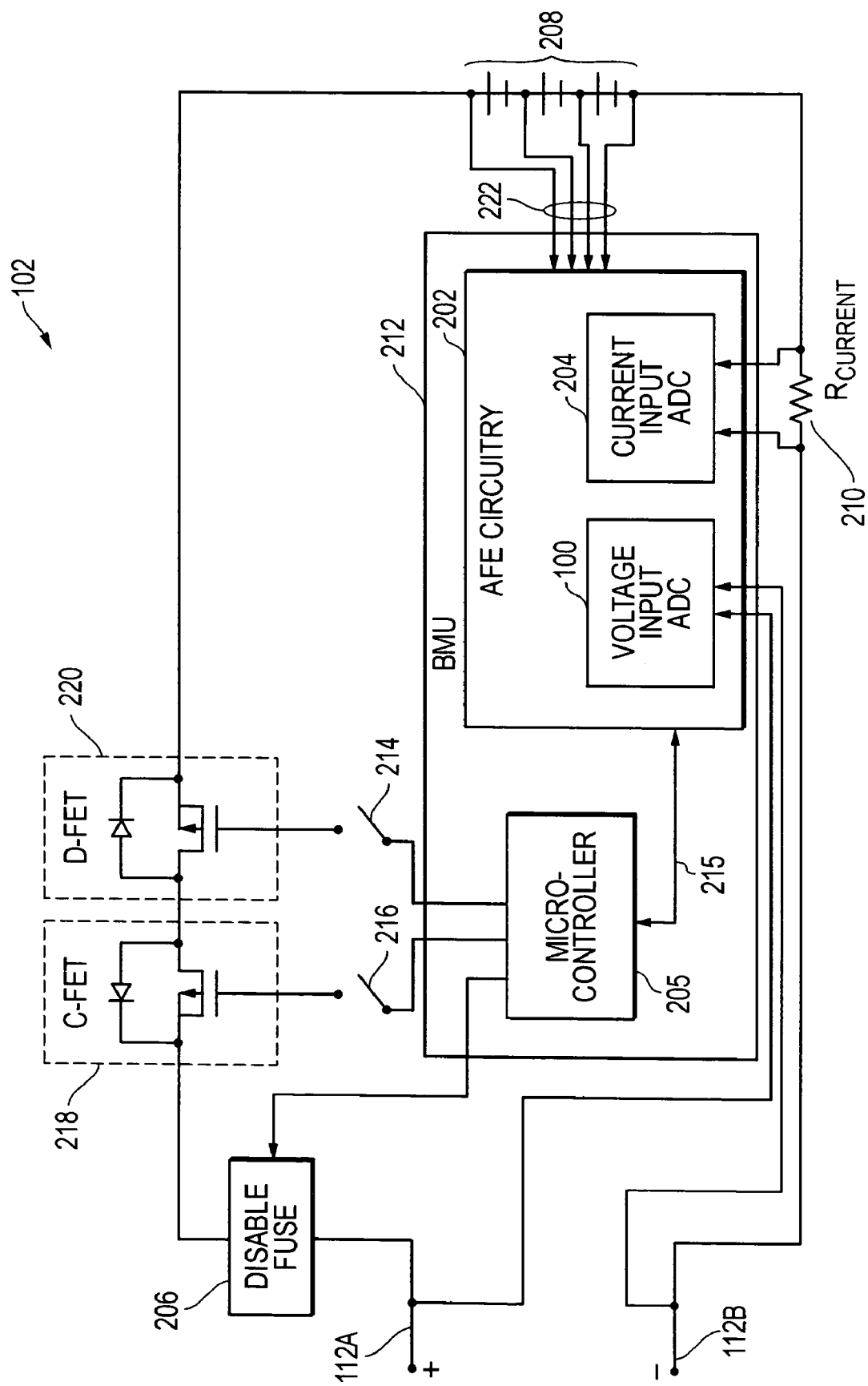
FIG. 2 is a block diagram for a smart battery according the present invention that utilizes input charging voltage to detect non-permanent charging failures.

FIG. 2 is a block diagram for a smart battery 102 according the present invention that measures input charging voltages to detect non-permanent charging failures. As depicted, the BMU 212 includes micro-controller 205 and AFE circuitry 202. The BMU 212 is connected to C-FET 218 through switch 216 and is connected to D-FET 220 through switch 214. C-FET 218 is turned "on" during charging operations by closing switch 216 and turned "off" during discharging operations by opening switch 216. C-FET 218 can be implemented, for example, using a NMOS power MOSFET with a diode connected between its source and drain to keep current from flowing into the cell pack 208 during charging operations. D-FET 220 is turned "on" during discharging operations by closing switch 214 and turned "off" during charging operations by opening switch 214. D-FET 220 can be implemented, for example, using a NMOS power MOSFET with a diode connected between its source and drain to keep current from flowing out from the cell pack 208 during charging operations. A disable fuse 206 is coupled in the input/output path from positive terminal 112A such that when blown, the battery 102 is permanently disabled. As depicted, the micro-controller 205 within the BMU 212 is configured to provide a control signal to the disable fuse 206 that will cause the fuse to be blown. A current sense resistor ($R_{CURRENT}$) 210 is included in the input/output path between the negative terminal 112B and the cell pack 208. The analog front end (AFE) circuitry 202 is part of the BMU 212 and is coupled to the cell pack 208. The AFE circuitry 202 and the micro-controller 205 can communicate through connections 215. The AFE circuitry 202 can be configured to detect voltage conditions on the cell pack 208 through connections 222, for example, through analog-to-digital conversion circuitry within the AFE circuitry 202. It is also noted that the voltage input ADC 100 could also be utilized to detect cell pack voltages, if desired. As depicted, the cell pack includes three cells connected in series.

The AFE circuitry 202 includes a current input ADC 204 and a voltage input ADC 100. The current input ADC 204 has inputs coupled to either side of the current sense resistor ($R_{CURRENT}$) 210. The value for the current through the current sense resistor ($R_{CURRENT}$) 210 can be determined, for example, by digitizing the voltage drop across the current sense resistor ($R_{CURRENT}$) 210, and then dividing by the known value for the resistor ($R_{CURRENT}$) 210. The voltage input ADC 100 has inputs coupled to the positive terminal 112A and the negative terminal 112B for the battery 102. As such, the voltage input ADC 100 can provide a digital value for the voltage at the input terminals to the battery 102. As indicated above, the voltage input ADC 100 can be used to detect the input charging voltage applied to the battery 102 as part of a failure detection verification procedure that is controlled by the micro-controller 205.

Figure 3:
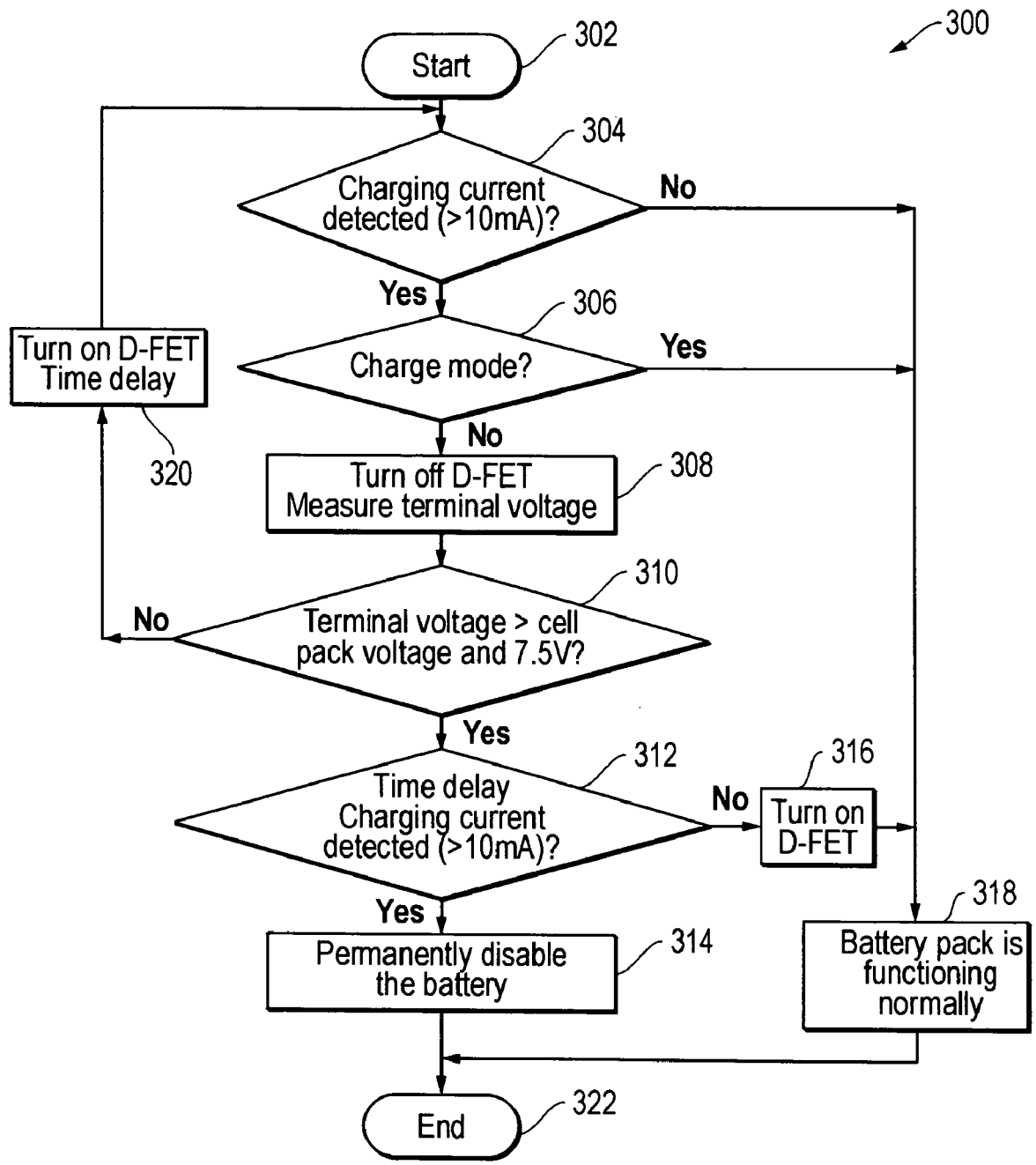
FIG. 3 is a process diagram for example procedural steps that can be used in determining non-permanent charging failures utilizing input charging voltage detection.

FIG. 3 is a process diagram for example procedural steps that can be used in verifying charging failures utilizing input voltage detection. In the embodiment 300 depicted, the procedure begins at the START block 302. Next, in decision block 304, the charging current is detected through the use of current input ADC 204. In the embodiment depicted, 10 milli-Amps (mA) have been selected as the threshold above which a charging current event will be deemed to have occurred. If the detected current is below 10 mA, then flow proceeds to block 318 where a determination is reached that the battery pack is functioning normally. Flow then proceeds to the END block 322. It is noted that current thresholds can be configured, as desired, depending upon the operational responses desired. For example, 1 mA may also be a threshold level that can be selected for embodiment 300.

If the detected current in decision block 304 is above 10 mA, then flow proceeds to decision block 306. If the battery is in charge mode, flow then passes to block 318 where processing ends as indicated above. If the battery is not in charge mode, then a possible battery failure will be deemed to have been detected. In other words, a charging current was detected when none should have existed. Process flow then moves to block 308. It is noted that if desired, decision block 306 could be removed, and the charging failure verification steps of FIG. 3 could be implemented only when the battery was not in charge mode. It is further noted that other operational and timing variations could be implemented, if desired, without departing from the present invention.

Once a possible charging failure has been indicated, block 308 beings an initial failure verification step. In block 308, the D-FET is turned "off," and the terminal voltage is measured through the voltage input ADC 100. Flow then proceeds to decision block 310. If the measured terminal voltage is greater than the cell pack voltage of cell pack 208 and greater than a set voltage level, such as 7.5 volts, then a charging failure would deemed to have been verified. Process flow would then move to decision block 312 for a second verification step. In decision block 310, if the measured terminal voltage is less than the cell pack voltage of cell pack 208 or less than a set voltage level, such as 7.5 volts, then the charging current detection would be deemed a false positive, and flow would pass to block 320 for a verification of the false positive. In block 320, a time delay would be initiated, after which the D-FET would be turned back "on." Flow would then proceed back to decision block 304 to determine if a charging current above the threshold still existed. It is noted that the time delay for block 320 can be configured as desired.

With respect to the second verification step, when decision block 312 is reached from decision block 310, a time delay is initiated, after which the input charging current is again detected using current input ADC 204. If this charging current is above a threshold level, such as 10 mA, then a battery failure is deemed to exist for the embodiment depicted. Flow proceeds to block 314 where the battery is permanently disabled, for example, using the disable fuse 206. In decision block 312, if the charging current is below the threshold level, then flow proceeds to block 316, where the D-FET is turned "on." Flow then proceeds to block 318 where the processing ends as indicated above.

In operation, therefore, there are three basic stages with respect to the embodiment 300 of FIG. 3. The first stage is a charge current monitoring stage, and the second two stages are failure verification stages. In the first stage, the input charging current is monitored using the current input ADC 204. When a charging current above a selected threshold is detected, i.e., a charging current of a certain level is flowing into the battery cell pack 208, then the operational mode for the battery is checked to see if it is charge mode. If the battery is not in charge mode, then a failure verification process is initiated. The first failure verification utilizes the voltage input ADC 100 to determine the voltage at the input terminals 112A and 112B to the battery 102. If this voltage is below the cell pack voltage or a selected voltage level, then the charging current detection during a non-charge mode of operation is deemed to have been a false failure detection. Flow then passes back to the monitoring stage. However, if the detected voltage is above the cell pack voltage and the selected voltage level, a second failure verification step is reached. This second failure verification step utilizes the current input ADC 204 to determine if a charging current above a threshold value still exists after a selected time delay. If not, then a false failure detection has occurred. If so, a failure is confirmed, and the battery is disabled.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein and certain features of the invention may be utilized independently of the use of other features, all as would be apparent to one skilled in the art after having the benefit of this description of the invention.

What is claimed is:

1. A battery utilizing input charging voltages to verify charging failures, comprising:
   positive and negative input terminals;
   a cell pack coupled to drive the positive and negative input terminals;
   a battery management unit (BMU) including a microcontroller;
   a charge transistor (C-FET) coupled between the positive input terminal and the cell pack and coupled to be controlled by the BMU;

a discharge transistor (D-FET) coupled between the positive input terminal and the cell pack and coupled to be controlled by the BMU;

a current sense resistor coupled between the negative input terminal and the cell pack;

a current input analog-to-digital converter (ADC) coupled to the current sense resistor; and a voltage input analog-to-digital converter (ADC) coupled to the positive and negative input terminals;

wherein the BMU is configured to utilize charging voltage values from the voltage input ADC to verify charging failures when a positive charging current into the battery above a desired current threshold level is detected using the current input ADC when the battery is not in charge mode and when a information handling system is configured to receive power from the cell pack and not from another power source.

2. The battery of claim 1, wherein the BMU is further configured to determine that a charging failure may have occurred if the charging voltage value is above a threshold value.

3. The battery of claim 2, wherein the BMU is further configured to determine that a charging failure has occurred if after a time delay, the charging current is above a threshold value.

4. The battery of claim 3, further comprising a disable fuse, and wherein the BMU is configured to blow the disable fuse if the BMU determines that a charging failure has occurred.

5. The battery of claim 1, wherein the BMU is configured to use an additional charging current measurement using the current input ADC to facilitate a further verification of whether or not a detected charging current was due to a positive battery failure.

6. The battery of claim 5, wherein the BMU is further configured to disable the battery if the additional charging current measurement is above a selected value thereby indicating that a positive battery failure has occurred.

7. The battery of claim 5, wherein the BMU is further configured to determine a false battery failure indication has occurred if the additional charging current measurement is below a selected value.

8. The battery of claim 1, wherein the BMU is further configured to disable the battery if a positive battery failure indication is determined and to continue operating the battery if a false battery failure indication is determined.

9. The battery of claim 8, further comprising a disable fuse, and wherein the BMU is further configured to permanently disable the battery by blowing the disable fuse if a positive battery failure indication is determined.

10. An information handling system configured to be powered by a battery or an alternating current to direct current (AC/DC) converter, comprising:

an alternating current to direct current (AC/DC) converter;

a load coupled to the AC/DC converter, the load representing powered circuitry for an information handling system;

a charger coupled to the AC/DC converter;

a battery coupled to the charger and to the load, the battery comprising:

positive and negative input terminals;

a cell pack coupled to drive the positive and negative input terminals;

a battery management unit (BMU), including a microcontroller and analog front end (AFE) circuitry;

a charge transistor coupled (C-FET_ between the positive input terminal and the cell pack and coupled to be controlled by the BMU;

a discharge transistor coupled (D-FET) between the positive input terminal and the cell pack and coupled to be controlled by the BMU;

a current sense resistor coupled between the negative input terminal and the cell pack;

a current input analog-to-digital converter (ADC) coupled to the resistor; and a voltage input analog-to-digital converter (ADC) coupled to the positive and negative input terminals;

wherein the BMU is configured to utilize charging voltage values from the voltage input ADC to verify charging failures when a positive charging current into the battery above a desired current threshold level is detected using the current input ADC when the battery is not in charge mode and when the information handling system is configured to receive power from the cell pack and not from another power source.

11. The information handling system of claim 10, wherein the BMU is further configured to determine that a charging failure may have occurred if the charging voltage value is above a threshold value.

12. The information handling system of claim 11, wherein the BMU is further configured to determine that a charging failure has occurred if after a time delay, the charging current is above a threshold value.

13. The information handling system of claim 12, further comprising a disable fuse, and wherein the BMU is configured to blow the disable fuse if the BMU determines that a charging failure has occurred.

14. The information handling system of claim 10, wherein the BMU is configured to use an additional charging current measurement using the current input ADC to facilitate a further verification of whether or not a detected charging current was due to a positive battery failure.

15. The information handling system of claim 14, wherein the BMU is further configured to disable the battery if the additional charging current measurement is above a selected value thereby indicating that a positive battery failure has occurred.

16. The information handling system of claim 14, wherein the BMU is further configured to determine a false battery failure indication has occurred if the additional charging current measurement is below a selected value.

17. The information handling system of claim 10, wherein the BMU is further configured to disable the battery if a positive battery failure indication is determined and to continue operating the battery if a false battery failure indication is determined.

18. The information handling system of claim 17, further comprising a disable fuse, and wherein the BMU is further configured to permanently disable the battery by blowing the disable fuse if a positive battery failure indication is determined.

* * * * *